(12) United States Patent
Sugimoto

(10) Patent No.: US 6,444,066 B1
(45) Date of Patent: Sep. 3, 2002

(54) METHOD FOR MANUFACTURING CERAMIC ELECTRONIC DEVICE

(75) Inventor: Yasutaka Sugimoto, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/651,409

(22) Filed: Aug. 30, 2000

(30) Foreign Application Priority Data

Aug. 30, 1999 (JP) ............................................ 11-242687

(51) Int. Cl.$^7$ ............................................. C04B 33/32
(52) U.S. Cl. ................................... 156/89.17; 264/619
(58) Field of Search ........................ 264/619; 156/89.17

(56) References Cited

U.S. PATENT DOCUMENTS 3,988,498 A * 10/1976 Maher ........................ 428/434
6,045,893 A * 4/2000 Fukushima et al. ......... 428/209

* cited by examiner

Primary Examiner—Christopher A. Fiorilla
(74) Attorney, Agent, or Firm—Dickstein, Shapiro, Morin & Oshinsky, LLP

(57) ABSTRACT

A highly reliable ceramic electronic device is manufactured by suppressing diffusion of silver, the ceramic device having a silver-based conductive pattern on a sintered glass ceramic compact primarily composed of $BaO$—$TiO_2$—$ReO_{3/2}$ dielectric ceramic powder. A method for manufacturing the ceramic electronic device involves the steps of blending $BaO$—$TiO_2$—$ReO_{3/2}$ dielectric ceramic powder and glass powder to form a powdered glass ceramic mixture, in which Re is a rare-earth element, molding the powdered glass ceramic mixture to form a glass ceramic compact having a predetermined shape, forming a silver-based conductive pattern on the glass ceramic compact, and heating the glass ceramic compact provided with the silver-based pattern at a heating rate of at least about 10° C./minute from a temperature of at least about 500° C., in which the total baking time at the temperature of at least about 500° C. is set to be about 20 to 90 minutes.

18 Claims, 5 Drawing Sheets

US 6,444,066 B1

METHOD FOR MANUFACTURING CERAMIC ELECTRONIC DEVICE

BACKGROUND OF THE INVENTION

1. Field of the Invention

The present invention relates to methods for manufacturing ceramic electronic devices, such as dielectric resonators, LC filters, laminated capacitors, and ceramic substrates.

2. Description of the Related Art

In order to miniaturize dielectric resonators and the like used in the microwave range, efforts have been made to form resonator bodies using dielectric ceramic compositions having high dielectric constants. This is to exploit a phenomenon in which, when the dielectric constant of a dielectric ceramic composition is represented by $\in \cdot r$, the wavelengths of electromagnetic waves in free space are shortened in the dielectric ceramic composition to $1/\sqrt{\in}$.

However, dielectric ceramic resonators having a temperature stability, in particular, having a temperature coefficient of static capacitance, which is practically usable, have $\in \cdot r$ of at most 100, and hence, requirements for further miniaturization cannot be satisfactorily fulfilled.

Under the conditions restricted by a relative dielectric constant of $\in \cdot r$, it is effective to use LC resonator circuits, which are known as circuits for microwaves in order to achieve miniaturization of dielectric resonators. That is, when a multi-layer structure, which is practically used in laminated capacitors, ceramic multi-layer substrates and the like, is applied to LC resonator circuits, a dielectric resonator which is further miniaturized and has high reliability can be constructed.

In order to construct an LC resonator having a high Q value in the microwave range, the electrical conductivity of a conductive pattern composing the LC resonator circuit must be high. The conductive pattern simultaneously baked with a dielectric ceramic composition must be of a metal material having high conductivity, such as gold, silver or copper.

Accordingly, the dielectric ceramic composition is required to be simultaneously sinterable with the conductive pattern composed of a metal having a low melting point, such as gold, silver or copper, in addition to having a high dielectric constant, a high Q value and a small change in capacitance with temperature. Among these metals, silver is known as a noticeably effective conductive material in terms of having the highest conductivity, being relatively inexpensive and being sinterable in the air.

Concerning dielectric layers (dielectric ceramic composition) having a high dielectric constant, various compositions have been investigated, and a dielectric composition composed of $BaO$—$TiO_2$—$ReO_{3/2}$ among those mentioned above has been known as a material having a high relative dielectric constants, a high Q value and a small temperature coefficient of static capacitance. However, the dielectric ceramic composition composed of $BaO$—$TiO_2$—$ReO_{3/2}$ generally has a high baking temperature of at least 1,250° C., and hence, the ceramic composition cannot be simultaneously baked with a metal having a low melting point, such as gold, silver or copper. Consequently, a low temperature sintering technique has been researched in order to decrease the baking temperature to 1,000° C. or less by adding a glass component, such as borosilicate glass, lead oxide glass or the like, to the dielectric ceramic composition.

For example, in Japanese Unexamined Patent Application Publication No. 6-40767, a sintered glass ceramic compact is described which is obtained by a step of forming a glass ceramic compact having a predetermined shape from a powdered glass ceramic mixture and a step of baking the glass ceramic compact at 1,000° C. for 2 hours. The powdered glass ceramic mixture mentioned above can be prepared by steps comprising baking dielectric ceramic powder primarily composed of $BaO$—$TiO_2$—$ReO_{3/2}$ at 1,050° C. or more, pulverizing the baked powdered glass ceramic mixture into a powder having an average particle diameter of not more than 0.8 $\mu$m, and adding glass powder primarily composed of $B_2O_3$ thereto; alternatively, it can be prepared by steps comprising adding glass powder primarily composed of $B_2O_3$ to dielectric ceramic powder primarily composed of $BaO$—$TiO_2$—$ReO_{3/2}$, baking the powdered mixture thus formed at 1,050° C. or more, and pulverizing the baked powdered mixture into a powder having an average particle diameter of not more than 0.8 $\mu$m.

According to the methods described above, a sintered glass ceramic compact which has a high relative dielectric constant, a high Q value and a small temperature coefficient of static capacitance, can be obtained by sintering at a temperature of not more than the melting point of a conductive material such as gold, silver or copper. However, since the baking time is long, such as 2 hours, when a glass ceramic compact has, in particular, a silver-based conductive pattern, substantial diffusion of silver occurs during baking, and reliability of the resulting sintered glass ceramic compact may be degraded in some cases.

SUMMARY OF THE INVENTION

To overcome the above described problems, preferred embodiments of the present invention provide a method for manufacturing a highly reliable ceramic electronic device in which diffusion of silver is suppressed when a ceramic electronic device is manufactured to provide a silver-based conductive pattern formed on a sintered glass ceramic compact primarily composed of $BaO$—$TiO_2$—$ReO_{3/2}$ dielectric ceramic powder.

One preferred embodiment of the present invention provides a method for manufacturing a ceramic electronic device comprising the steps of blending $BaO$—$TiO_2$—$ReO_{3/2}$ dielectric ceramic powder and glass powder to form a powdered glass ceramic mixture, in which Re is a earth rare element, molding the powdered glass ceramic mixture to form a glass ceramic compact having a predetermined shape, forming a silver-based conductive pattern on the glass ceramic compact, and heating the glass ceramic compact provided with the silver-based pattern at a heating rate of at least about 10° C./minute from a temperature of at least 500° C. and holding the glass ceramic compact above 500° C. for about 20 to 90 minutes.

In the above described method, the heating step may comprise heating the glass ceramic compact to the maximum temperature being used at the heating rate in the temperature range mentioned above, i.e., above about 500° C., holding the glass ceramic compact at the maximum temperature for about 10 to 60 minutes, and cooling the glass ceramic compact at a cooling rate of at least about 10° C./minute in the temperature range.

In the above described method, the dielectric ceramic powder may have a composition represented by the formula $xBaO$—$yTiO_2$—$zReO_{3/2}$, in which $5 \leq x \leq 20$, $52.5 \leq y \leq 70$, $15 \leq z \leq 42.5$, and $x+y+z=100$.

In the above described method, the dielectric ceramic powder may comprise about 3 to 30 percent by weight of bismuth oxide calculated of as $Bi_2O_3$.

In the above described method, the glass powder may be borosilicate glass powder comprising $SiO_2$ and $B_2O_3$.

In the above described method, the glass powder may comprise about 13 to 50 percent by weight of $SiO_2$, about 3 to 30 percent by weight of $B_2O_3$, about 40 to 80 percent by weight of an alkaline earth metal oxide and about 0.1 to 10 percent by weight of an alkali metal oxide.

In the above described method, the powdered glass ceramic mixture may comprise copper oxide powder.

In the above described method, the powdered glass ceramic mixture may comprise about 75 to 95 percent by weight of the dielectric ceramic powder, about 2 to 20 percent by weight of the glass powder and not more than about 5 percent by weight of the copper oxide powder.

According to the method for manufacturing the ceramic electronic device of the present invention, since the glass ceramic compact provided with the silver-based conductive pattern is heated (baking treatment) at a heating rate of at least about 10° C./minute in the temperature range of at least 500° C. and is held in the temperature range for about 20 to 90 minutes, diffusion of silver can be suppressed, whereby the ceramic electronic device having the highly reliable sintered glass ceramic compact can be manufactured. The resultant sintered glass ceramic compact obtained by the heat treatment for a short time thus described has a high relative dielectric constant, a high Q value and superior temperature stability, and as a result, a compact and improved ceramic electronic can be obtained.

In this connection, when a glass ceramic compact and a silver-based conductive material are co-fired, silver having a high rate of diffusion in a glass component diffuses therein, and the diffusion distance of the silver is proportional to the square root of the baking time. Accordingly, the glass ceramic compact is heated at a high rate of 10° C./min in the high temperature range of at least 500° C. and the heat-treatment time (a baking time) of the glass ceramic compact in the temperature range is set to be extremely short, such as not to be more than about 90 minutes, whereby diffusion of silver can be suppressed. On the other hand, when the heat-treatment time is less than about 20 minutes, the glass ceramic compact may be damaged due to thermal shock, and hence, a heat-treatment time of not less than 20 minutes is required.

The glass ceramic compact primarily composed of $BaO$—$TiO_2$—$ReO_{3/2}$ dielectric ceramic powder having superior characteristics can be simultaneously baked with the silver-based conductive pattern having low resistivity, and as a result, a ceramic electronic device having superior high-frequency characteristics can be obtained.

Since the sintered glass ceramic compact having a high relative dielectric constant and a high Q value can be formed, ceramic electronic devices, such as LC resonators, LC filters and laminated capacitors, can be further miniaturized and improved, and in addition, ceramic multi-layer substrates having superior capacitors therein in terms of temperature stability can be manufactured.

DESCRIPTION OF THE PREFERRED EMBODIMENTS

Hereinafter, a method for manufacturing a ceramic electronic device according to the present invention will be described with reference to FIG. 1.

A powdered glass ceramic mixture is prepared by blending $BaO$—$TiO_2$—$ReO_{3/2}$ dielectric ceramic powder and glass powder. Then, the powdered glass ceramic mixture is dispersed in an organic vehicle, and the resultant slurry (or a paste) is molded into a sheet by the doctor blade method or the like. Subsequently, a glass ceramic compact thus formed is provided with a silver-based conductive pattern and is then heated in accordance with the baking profile shown in FIG. 1.

Figure 1:
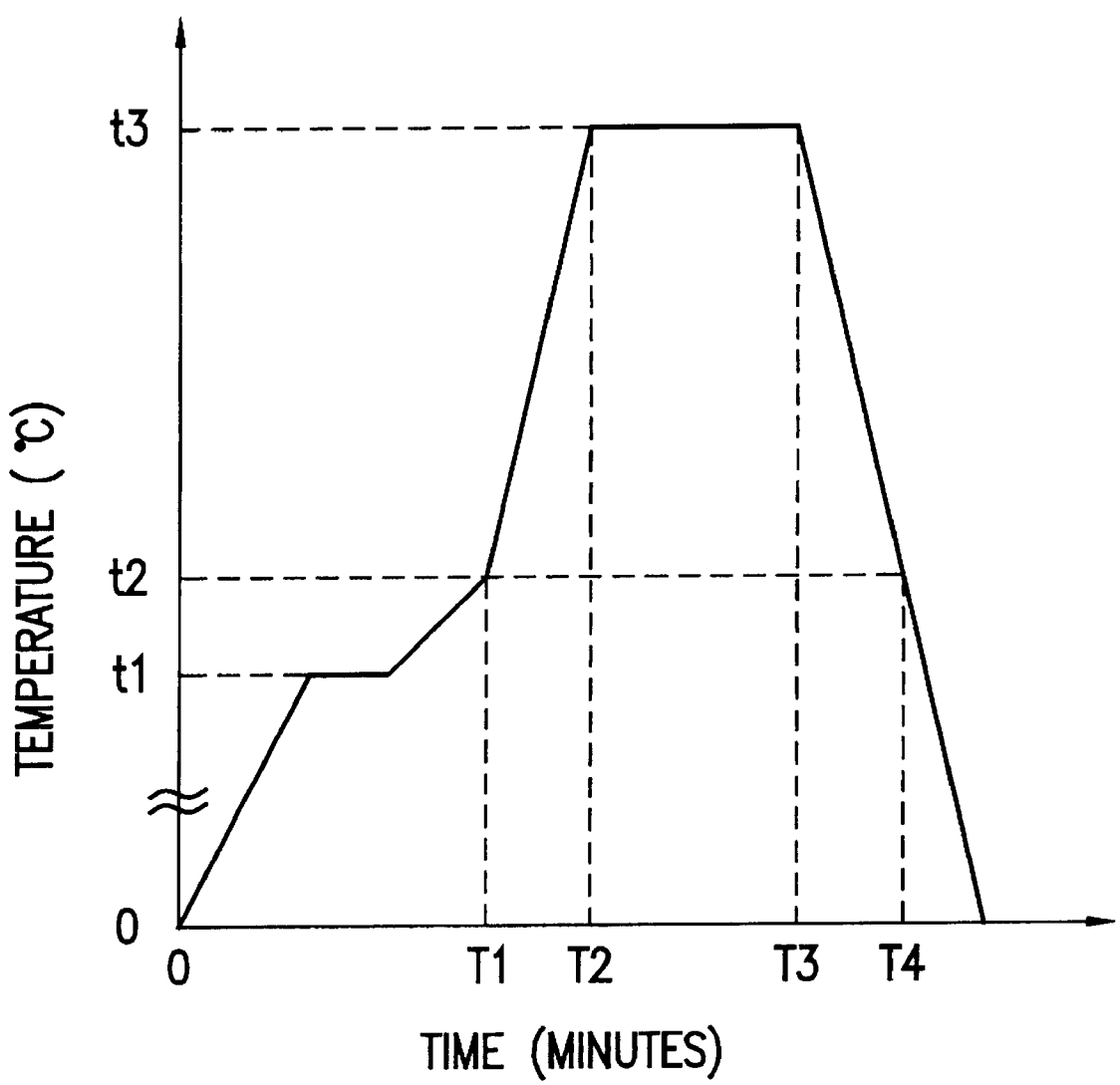
FIG. 1 is a graph showing a baking profile for a sintered glass ceramic compact of the present invention.

As shown in FIG. 1, the green glass ceramic compact having the silver-based conductive pattern is treated at T1 so as to remove binder therefrom. Then, the glass ceramic compact is rapidly heated at a rate of at least about 10° C./min from t2 to t3 in a temperature range of at least 500° C. By setting the total baking time, i.e., time for heat treatment in the temperature range of at least 500° C. to be about 20 to 90 minutes, the glass ceramic compact is sintered.

More preferably, sintering of the glass ceramic compact starts at the temperature t2 (=500° C.), and the temperature in the temperature range of at least 500° C. is rapidly increased at a rate of at least about 10° C./min to the maximum temperature t3. Next, the maximum temperature t3 is maintained for about 10 to 60 minutes so as to facilitate sintering of the glass ceramic compact. The temperature is then decreased from the maximum temperature t3 at a rate of at least about 10° C./min, and the sintering is completed at the temperature t2. Subsequently, by slowly cooling the sintered glass ceramic compact, the sintered glass ceramic compact having the silver-based conductive pattern, i.e., the ceramic electronic device is completed.

According to the present invention, since the temperature is increased at a rate of at least about 10° C./min from t2 to t3 in the temperature range of at least 500° C., and the heat-treatment time (T4–T1) in the temperature range is set to be about 20 to 90 minutes, the resultant sintered glass ceramic compact can be sufficiently densified, and in addition, a high quality ceramic electronic device having high reliability can be formed by suppressing diffusion of silver so that it is as small as possible.

Next, a material composition suitable for the baking profile described above will be described.

In the present invention, Re in the $BaO$—$TiO_2$—$ReO_{3/2}$ dielectric ceramic powder is a earth rare element, and as the earth rare element Re, scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) or lutetium (Lu) can be used. These rare-earth elements can be used alone or in combination.

In the present invention, the silver-based conductive pattern is a conductive pattern composed of silver (Ag), a silver-platinum (Ag—Pt), a silver-palladium (Ag—Pd), or the like, and the conductive pattern includes a wiring pattern, an electrode pattern, an electrode pad, a land and a via hole.

Figure 2:
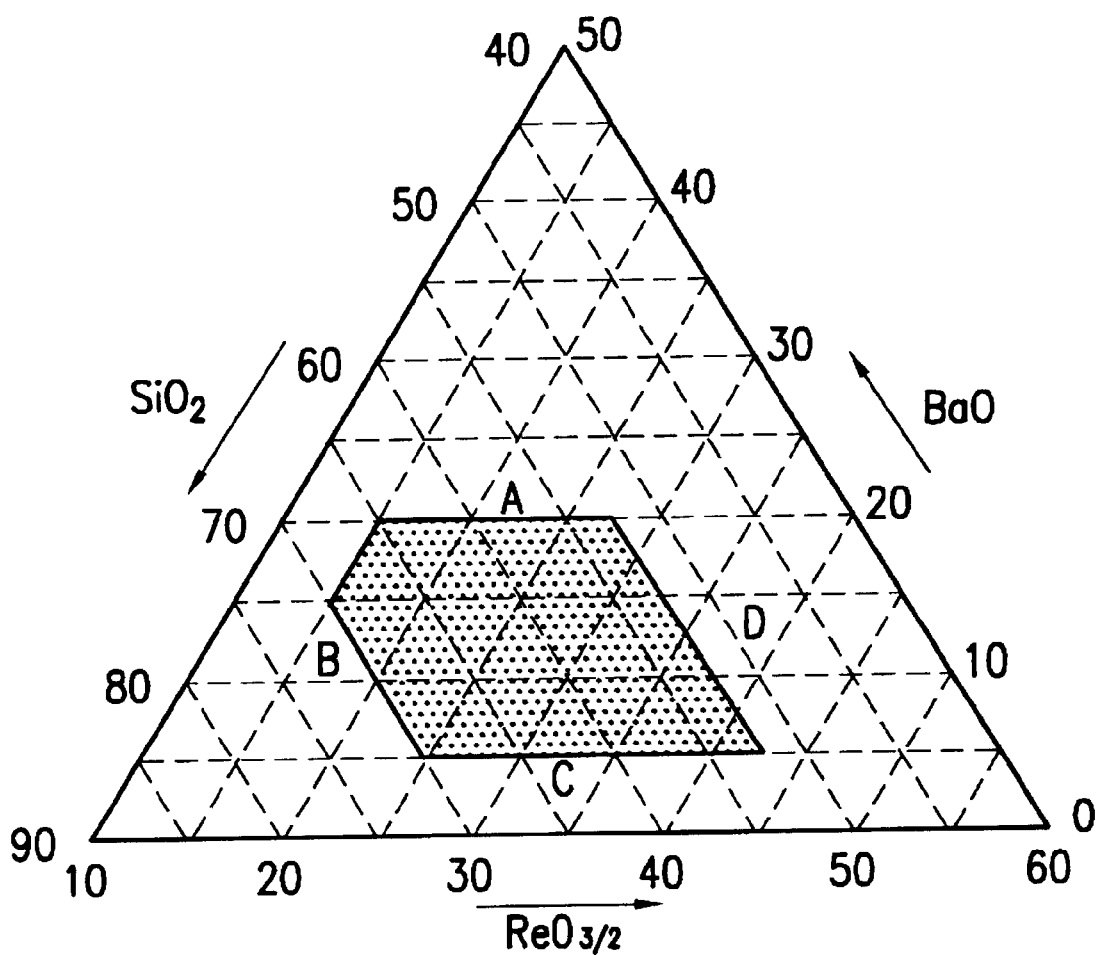
FIG. 2 is a ternary phase diagram showing a composition in a molar ratio of dielectric ceramic powder suitable for the present invention.

Furthermore, the $BaO$—$TiO_2$—$ReO_{3/2}$ dielectric ceramic powder, when represented by $xBaO$—$yTiO_2$—$zReO_{3/2}$, preferably has a composition having molar ratios of $5 \leq x \leq 20$, $52.5 \leq y \leq 70$, and $15 \leq z \leq 42.5$, as shown in FIG. 2, in which $x+y+z=100$.

In the baking profile described above, it is difficult for sintering to occur in region A in FIG. 2 and it is difficult to obtain a dense sintered body. In region B, temperature characteristics, i.e., the rate of change with temperature in static capacitance of the glass ceramic compact, may increase towards the negative side. In region C, sintering properties may be unstable in addition to the relative dielectric constant of the glass ceramic compact decreasing. In addition, in region D, the rate of change with temperature in static capacitance of the glass ceramic compact may increase towards the positive side and the relative dielectric constant thereof tends to decrease.

In the present invention, the $BaO$—$TiO_2$—$ReO_{3/2}$ dielectric ceramic powder preferably contains bismuth oxide, and the content of the bismuth oxide as $Bi_2O_3$ is preferably about 3 to 30 percent by weight.

When the $BaO$—$TiO_2$—$ReO_{3/2}$ dielectric ceramic powder contains $Bi_2O_3$, stable characteristics specifically in a high-frequency range can be obtained, and the sintering temperature of a glass ceramic compact tends to decrease. In the case in which the content of bismuth oxide as $Bi_2O_3$ exceeds about 30 percent by weight, the Q value of the glass ceramic compact may decrease. On the other hand, in the case in which the content of bismuth oxide as $Bi_2O_3$ is less than about 3 percent by weight, the sintering temperature decreases and advantages in the improvement in high-frequency characteristics is not significantly obtained.

Lead oxide can be added to the $BaO$—$TiO_2$—$ReO_{3/2}$ dielectric ceramic powder with or without bismuth oxide. Lead oxide also has an effect of smoothly facilitating sintering of a glass ceramic compact. The content of lead oxide as PbO, when used instead of bismuth oxide, is preferably about 3 to 30 percent by weight for the same reason as described for the bismuth oxide. When lead oxide is used with bismuth oxide, the total amount of bismuth oxide and lead oxide is preferably about 3 to 30 percent by weight.

In the present invention, the glass powder is preferably of borosilicate glass comprising silicon dioxide ($SiO_2$) and boron oxide ($B_2O_3$). In addition, the borosilicate glass preferably has a composition of $SiO_2$—$B_2O_3$-alkaline earth metal oxide-alkali metal oxide. As an alkaline earth metal oxide, for example, at least one of barium oxide (BaO), strontium oxide (SrO), calcium oxide (CaO) and magnesium oxide (MgO) can be used, and as an alkali metal oxide, for example, at least one of lithium oxide ($Li_2O$), sodium oxide ($Na_2O$) and potassium oxide ($K_2O$) can be used.

The $SiO_2$—$B_2O_3$-alkaline earth metal oxide-alkali metal oxide glass powder is preferably composed of about 13 to 50 percent by weight of $SiO_2$, about 3 to 30 percent by weight of $B_2O_3$, about 40 to 80 percent by weight of an alkaline earth metal oxide and about 0.1 to 10 percent by weight of an alkali metal oxide.

Among these components, when the content of $SiO_2$ exceeds about 50 percent by weight of the total glass powder, the softening point of the glass composition is so high that the sintering temperature of the glass ceramic compact tends to increase. On the other hand, when the $SiO_2$ is less than about 13 percent by weight, the humidity resistance of the sintered glass ceramic compact may decrease in some cases.

$B_2O_3$ functions to decrease the viscosity of glass and to smoothly facilitate sintering of a glass ceramic compact. However, when the content of $B_2O_3$ exceeds about 30 percent by weight of the total glass powder, the humidity resistance of the sintered glass ceramic compact tends to decrease, and when the content of $B_2O_3$ is less than about 3 percent by weight, sintering of the glass ceramic compact at a lower temperature may be difficult to perform in some cases.

The alkaline earth metal oxides function to facilitate reaction between the dielectric ceramic component and the glass component and function to lower the softening point of the glass component. However, when the content of alkaline-earth oxide exceeds about 80 percent by weight of the total glass powder, the humidity resistance of the sintered glass ceramic compact tends to decrease and when the content of alkaline-earth oxide is less than about 40 percent by weight, the sintering characteristics are degraded and sintering of the glass ceramic compact at a lower temperature may be difficult to perform in some cases.

The alkaline earth metal oxide contains at least BaO, and the content thereof is preferably about 40 to 95 percent by weight. When the content of BaO in the alkaline earth metal oxide exceeds about 95 percent by weight, the humidity resistance of the sintered glass ceramic compact tends to decease and when the content is less than about 40 percent by weight, sintering at lower temperature may be difficult to perform in some cases. The alkaline earth metal oxide preferably contains not less than about 5 percent by weight of at least one of SrO, CaO and MgO. When the content thereof is less than about 5 percent by weight, a problem with regard to humidity resistance of the glass ceramic compact may occur.

An alkali metal oxide, specifically $Li_2O$, functions to decrease the softening point of the glass component. When the content of alkali metal oxide exceeds about 10 percent by weight, a problem with regard to humidity resistance of the sintered glass ceramic compact may occur and when the content is less than about 0.1 percent by weight, the softening point of the glass component is lowered, and sintering of the glass ceramic compact at a lower temperature may be difficult to perform in some cases.

In the present invention, the powdered glass ceramic mixture preferably contains powdered copper oxide. A powdered copper oxide (specifically CuO) is an effective sintering auxiliary agent and can decrease the sintering temperature. In addition, a powdered copper oxide can increase the Q value and the relative dielectric constant of a sintered glass ceramic compact.

In the present invention, the powdered glass ceramic mixture is preferably a powdered mixture composed of about 75 to 95 percent by weight of the $BaO$—$TiO_2$—$ReO_{3/2}$ dielectric ceramic powder, about 2 to 20 percent by weight of the glass powder, and not more than about 5 percent by weight of the powdered copper oxide.

When the content of glass powder exceeds about 20 percent by weight, the humidity resistance of the sintered glass ceramic compact may decrease or the relative dielectric constant thereof may decrease. On the other hand, when the content thereof is less than about 2 percent by weight, sintering of the glass ceramic compact at a lower temperature tends to be difficult to perform in some cases. The content of powdered copper oxide as CuO in the powdered glass ceramic mixture is preferably about 5% or less. When the content thereof exceeds about 5 percent by weight, the insulating resistance of the sintered glass ceramic compact may decrease the Q value thereof may decrease, or the temperature coefficient of static capacitance may increase toward the positive side.

$TiO_2$, $CaTiO_3$, $SrTiO_3$, $Nd_2Ti_2O_7$ and the like can be contained in the powdered glass ceramic mixture. These additives are effective for adjusting the temperature coefficient of static capacitance. For example, since $TiO_2$, $CaTiO_3$ and $SrTiO_3$ have a negative temperature coefficient, and $Nd_2Ti_2O_7$ has a positive temperature coefficient, by blending an appropriate amount of these additives with the powdered glass ceramic mixture, the temperature coefficient of the sintered glass ceramic compact can be adjusted to a desired value.

Next, an example of a manufacturing method for the ceramic electronic device of the present invention will be specifically described.

$BaCO_3$ powder, $TiO_2$ powder and $ReO_{3/2}$ powder are respectively measured so as to have desired molar ratios of BaO, $TiO_2$ and $ReO_{3/2}$, and are blended. Then, by adding a predetermined amount of $Bi_2O_3$, a dielectric ceramic powder is prepared. Subsequently, CuO powder is added to the dielectric ceramic powder so as to have a desired composition ratio, and sufficiently blended.

In the step described above, the added amount of the CuO powder is preferably about 0.1 to 2.0 parts by weight to 100 parts by weight of the dielectric ceramic powder. When the added amount of the CuO powder exceeds about 2.0 parts by weight in this step, the Q value of the sintered glass ceramic compact may decrease in some cases. On the other hand, when the added amount is less than about 0.1 part by weight, the effect of lower temperature sintering, specifically, the effect of lower temperature sintering on baking temperature, tends to decrease.

Next, the resultant powdered mixture of raw ingredients is baked at a predetermined baking temperature for a predetermined time. The baking is preferably performed at about 950° C. or above. When the baking temperature is less than about 950° C., a major crystalline phase such as $Ba(Nd,Bi)_2Ti_4O_{12}$ may not be generated in some cases. Since even when the baking temperature is less than 1,050° C., the major crystalline phase is sufficiently precipitated, the baking temperature is preferably not more than 1,050° C. in consideration of the cost of baking. In particular, when the baking temperature exceeds 1,050° C., fine pulverization of the powdered mixture of the raw ingredients tends to be difficult.

Next, the baked powdered mixture of the raw ingredients thus formed is pulverized so as to have a desired average particle diameter by using, for example, a ball mill. The baked powdered mixture of the raw ingredients is preferably pulverized so as to have an average particle diameter of not more than about 2.0 $\mu$m. When the average particle diameter of the baked powdered mixture of the raw ingredients exceeds about 2.0 $\mu$m, the sintering characteristics of the major crystalline phase is degraded, and hence, low temperature sintering is difficult to perform. The baked powdered mixture of the raw ingredients preferably has an average particle diameter of not less than about 0.1 $\mu$m due to less agglomeration and easy moldability thereof.

Next, borosilicate glass powder is added to the pulverized powdered mixture of the raw ingredient and is blended, whereby a powdered glass ceramic mixture is prepared. A borosilicate glass powder can be used which is produced by steps comprising sufficiently blending glass powder primarily composed of $B_2O_3$ and $SiO_2$ with additive components, such as BaO, SrO, CaO, MgO and $Li_2O$, melting the mixture thus formed at 1,100° C. to 1,400° C., quenching the molten mixture thereof, and wet-pulverizing the quenched mixture using ethanol or the like. In addition, CuO is preferably added to the glass powder since the CuO itself functions as a sintering auxiliary agent, and hence, the softening point of the glass component can be decreased.

Next, an appropriate amount of an organic binder, a plasticizer, an organic solvent and the like are added to the resultant powdered glass ceramic mixture, and are then sufficiently blended together, whereby a paste composition or a slurry composition is prepared. After the paste composition or the slurry composition thus obtained is molded or coated on a substrate composed of, for example, alumina, a silver-based pattern is formed thereon. Subsequently, baking is performed in accordance with the baking profile shown in FIG. 1.

According to the method described above, in addition to being possible to obtain an extremely high quality sintered glass ceramic compact having a small diffusion of silver, the costs incurred by baking can be decreased since precipitation of the major crystalline phase can be observed at a relatively lower temperature of approximately 950 to 1,050° C. Furthermore, a sintered glass ceramic compact sinterable at a relatively low temperature of not more than the melting point of silver can be formed in which the relative dielectric constant is relatively high, the Q value is high and the temperature coefficient of static capacitance is small.

Next, an example of the present invention when applied to an LC filter will be explained with reference to FIGS. 3 to 5.

A powdered glass ceramic mixture is prepared by blending $BaO$—$TiO_2$—$ReO_{3/2}$ dielectric ceramic powder and glass powder, and an organic vehicle is added to the powdered glass ceramic mixture, thereby obtaining a slurry composition. A ceramic green sheet having a thickness of, for example, 40 $\mu$m, is formed by a casting method or the like using the slurry composition described above. Next, after drying, the green sheet is cut into a predetermined size, whereby ceramic green sheets 2a to 2m are formed.

Figure 3:
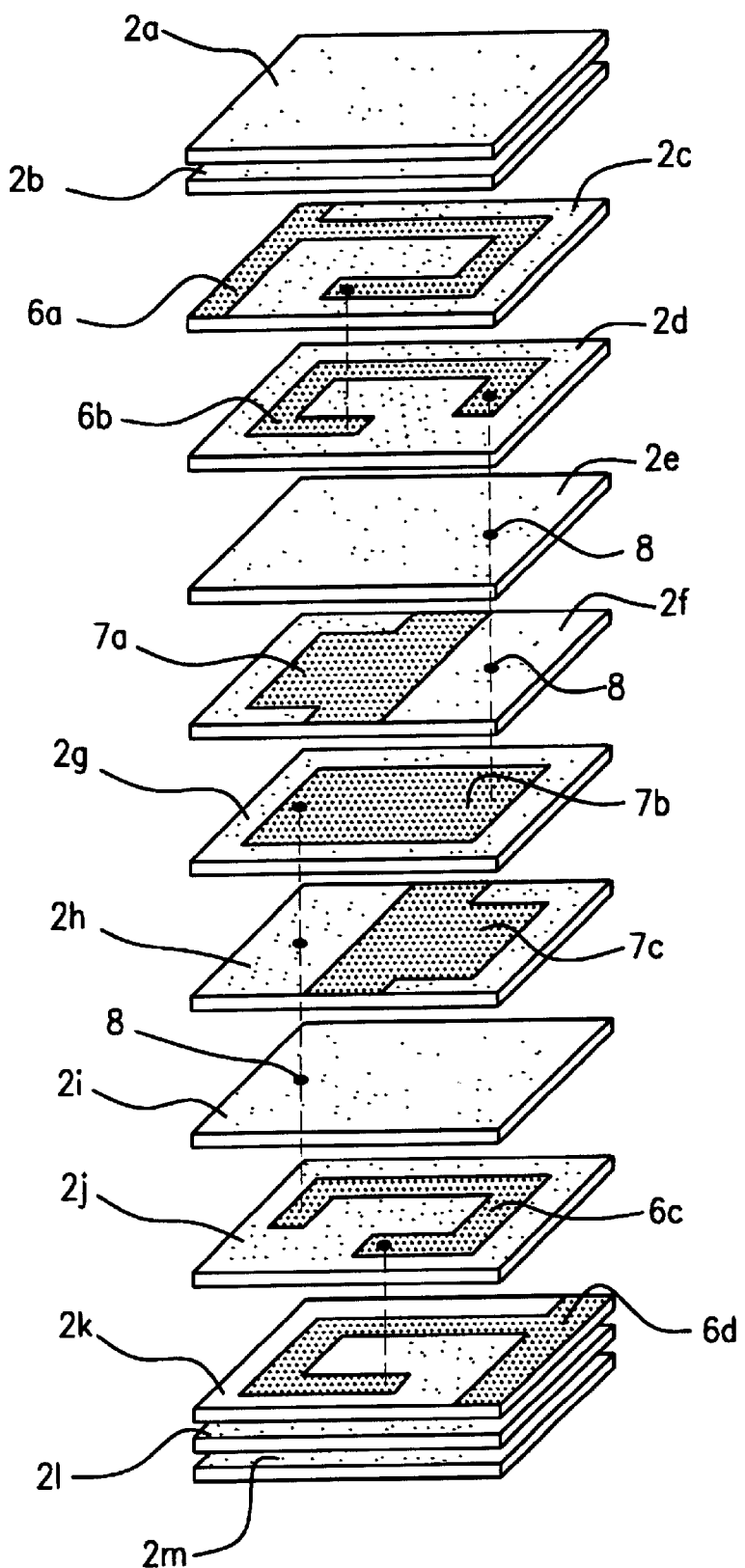
FIG. 3 is a schematic cross-sectional view of an LC filter according to an embodiment of the present invention.

As shown in FIG. 3, after forming via holes 8 in the green sheets 2a to 2m when necessary, patterns 6a to 6b for a coil L1, patterns 7a to 7c for a capacitor C, and patterns 6c to 6d for a coil L2 are formed by screen printing using a silver paste or the like, and then the green sheets 2a to 2m are laminated and pressed, whereby the glass ceramic compact is formed.

The glass ceramic compact thus formed is heated, for example, at a heating rate of at least about 10° C./minute at a high temperature of at least 500° C. and is then held at a maximum temperature of approximately 900° C. for approximately 60 minutes. External electrodes 3a, 3b, 4a, and 4b are formed on edge surfaces of a resultant sintered glass ceramic compact 2 as shown in FIG. 4, and an LC filter 1 having the capacitor C, and the coils L1 and L2 therein is formed. The LC filter 1 has the equivalent circuit as shown in FIG. 5.

When the LC filter 1 is formed, since the glass ceramic compact formed of the powdered glass ceramic mixture comprising the $BaO-TiO_2-ReO_{3/2}$ dielectric ceramic powder blended with the glass powder is baked in accordance with the baking profile of the present invention, internal electrodes primarily composed of silver having low resistivity can be simultaneously formed during the baking, whereby a high quality LC filter which has superior high-frequency characteristics and is reliable can be obtained.

Figure 4:
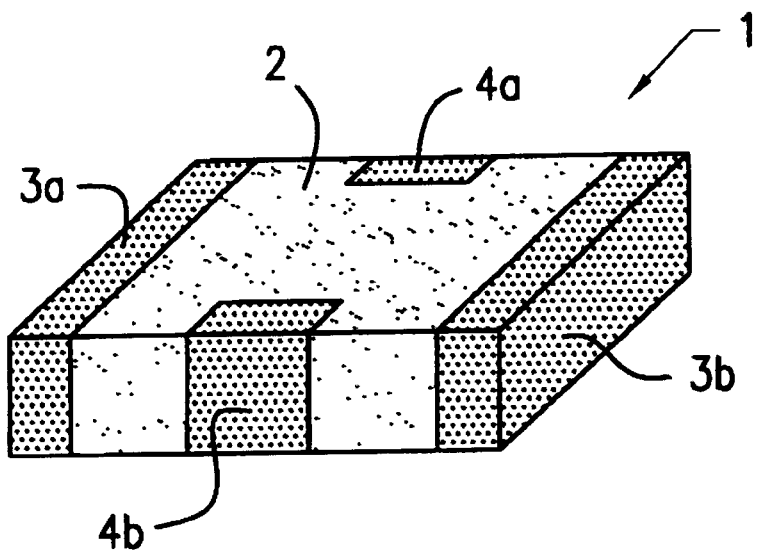
FIG. 4 is a schematic perspective view of the LC filter.
Figure 5:
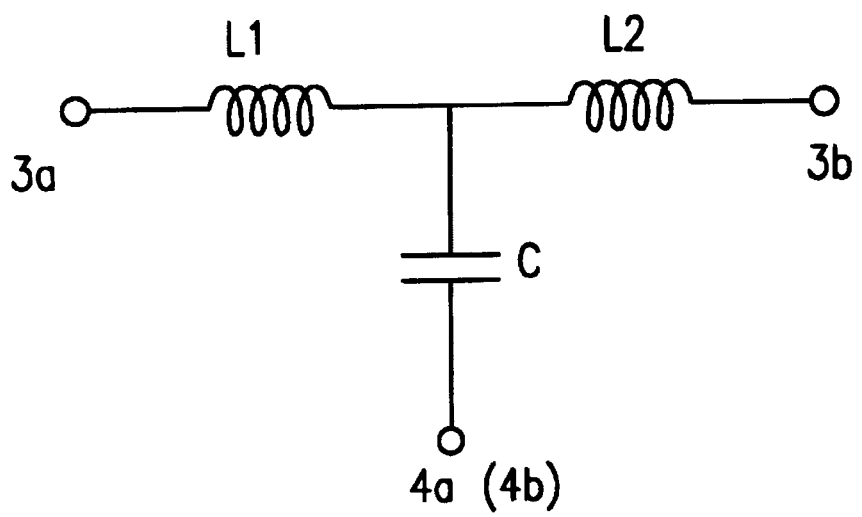
FIG. 5 is an equivalent circuit of the LC filter.
Figure 6:
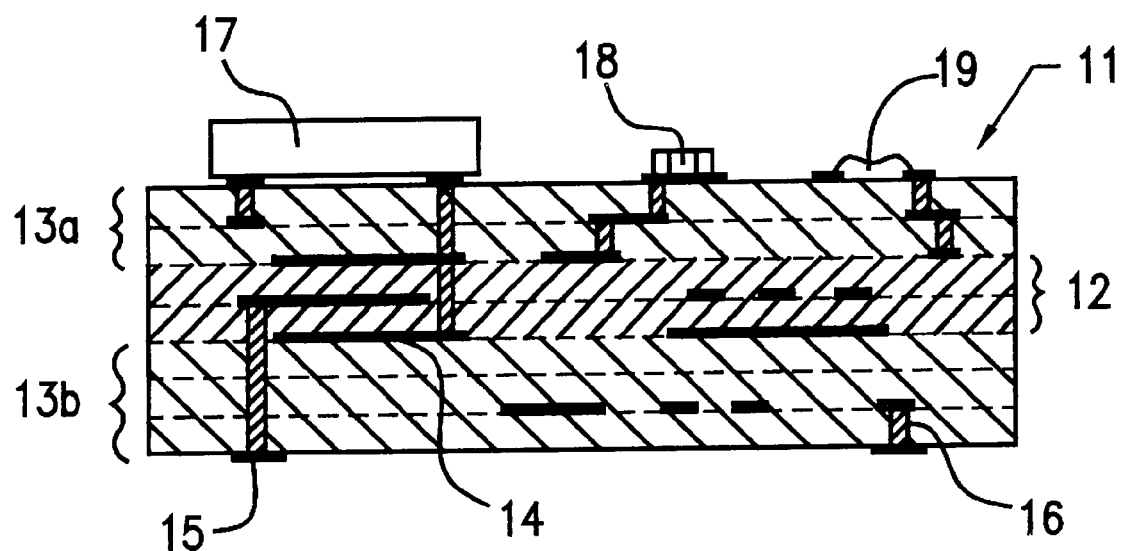
FIG. 6 is a schematic cross-sectional view of a ceramic multi-layer substrate according to an embodiment of the present invention.

The present invention is not limited to the LC filters shown in FIGS. 3 to 5. For example, the present invention can be applied to methods for manufacturing chip-shaped electronic devices, such as LC resonators, laminated chip capacitors, and chip antennas.

In addition, the present invention can be applied to methods for manufacturing ceramic multi-layer substrates 11 to be mounted with semiconductor integrated circuit (IC) chips 17, chip capacitors 18, thick film resistors 19 and the like. The ceramic multi-layer substrate 11 is composed of insulating layers 13a and 13b and dielectric layers 12, which are formed by a green sheet lamination method. In addition, the ceramic multi-layer substrate 11 has internal electrodes 14 and via holes 16 formed of an Ag-based conductive material, and external electrodes 15 formed of an Ag-based or Cu-based conductive material.

Consequently, the present invention can also be applied to a baking profile for laminated ceramic bodies thus described. According to the green sheet lamination method, a ceramic multi-layer substrate having a resonator function or a filter function therein, which is provided with a high relative dielectric constant and a high Q value, can be further miniaturized. In addition, since the dielectric layer 12 is a dielectric layer having a high dielectric constant, a capacitor having a high capacitance can be embedded therein.

EXAMPLES

Hereinafter, the present invention will be described with reference to particular examples.

$BaCO_3$, $TiO_2$ and $NdO_{3/2}$ were measured so as to have molar ratios of BaO, $TiO_2$ and $NdO_{3/2}$ as shown in Table 1 below, and were then blended. Then, $Bi_2O_3$ and PbO powder were added so as to have composition ratios as shown in Table 1, and, after adding CuO thereto followed by sufficient blending, baking was performed at 900 to 1,200° C. for 2 hours. The baked mixture thus obtained was pulverized using a ball mill, and $BaO-TiO_2-NdO_{3/2}$ dielectric ceramic powder was prepared.

TABLE 1

| Sample | Major component (molar ratio) | | | Accessory component | |
|---|---|---|---|---|---|
| # | BaO | $TiO_2$ | $NdO_{3/2}$ | Composition | (wt %) |
| S1 | 13 | 61 | 26 | $Bi_2O_3$ | 10 |
| S2 | 13 | 61 | 26 | — | 0 |
| S3 | 13 | 61 | 26 | PbO | 10 |

Meanwhile, BaO, SrO, CaO, MgO, $B_2O_3$, $SiO_2$ and $LiO_2$ were measured so as to have composition ratios (weight ratios) shown in Table 2 and were then sufficiently blended. Then, the mixtures thus formed were melted at 1,100 to 1,400° C., were immersed into water for quenching, and were wet-pulverized with ethanol, whereby a borosilicate glass powder was obtained.

TABLE 2

| | Glass composition | | | | | | | |
|---|---|---|---|---|---|---|---|---|
| | | Alkaline-earth oxide RO | | | | | | |
| | RO | wt % of components in RO | | | | | | |
| Glass | Total | BaO | SrO | CaO | MgO | $B_2O_3$ | $SiO_2$ | $Li_2O$ |
| G1 | 61 | 82 | 11 | 5 | 2 | 14 | 23 | 2 |

The borosilicate glass was added to the $BaO-TiO_2-NdO_{3/2}$ ceramic powder so as to have a composition ratio shown in Table 4 below, and a powdered glass ceramic mixture was thus prepared. In addition, as an accessory component for the powdered glass ceramic mixture, CuO was added thereto so as to have a composition ratio shown in Table 4 below, and the mixture thus obtained was then sufficiently blended, whereby a starting composition material was prepared. The starting composition material was continued with an appropriate amount of an organic binder, a plasticizer and a solvent, and was kneaded, whereby a slurry was obtained.

A 50 μm-thick sheet was formed from the resultant slurry by a doctor blade method, the ceramic green sheet thus formed was cut into a size 30 mm long and 10 mm wide, and sheets thus formed were laminated after printing silver electrodes thereon. After performing a binder removing treatment at 400° C. in the air, the laminates described above were baked in accordance with the profiles (baking pattern) shown in Table 3, whereby sintered glass ceramic compacts in the form of a plate represented by examples 1 to 10 shown in Table 4 were obtained.

TABLE 3

| Baking pattern # | Heating rate (° C./min) | Maximum temperature (° C.) | Holding time at maximum temperature (min) | Cooling rate (° C./min) | Total baking time (minutes at 500° C. or more) |
|---|---|---|---|---|---|
| P1 | 10 | 900 | 10 | 10 | 90 |
| P2 | 10 | 900 | 30 | 10 | 110 |
| P3 | 20 | 900 | 15 | 20 | 55 |
| P4 | 20 | 900 | 60 | 20 | 100 |
| P5 | 50 | 900 | 30 | 50 | 46 |
| P6 | 50 | 930 | 15 | 50 | 32 |
| P7 | 80 | 900 | 10 | 75 | 20 |
| P8 | 100 | 900 | 5 | 75 | 13 |

Q values, insulating resistances and diffusion amounts (diffusion distance of Ag) of silver electrodes were measured for the sintered glass ceramic compacts of the samples 1 to 10 thus obtained. Dielectric characteristics were measured at 1 MHZ. The results are shown in Table 4 below. In Table 4, wt % indicates percent by weight.

TABLE 4

| Example | Dielectric ceramic Sample # | wt % | Glass (wt %) | CuO (wt %) | Baking pattern # | Q Value | logIR[1] (Ωcm) | Ag distance[2] (μm) | Remarks |
|---|---|---|---|---|---|---|---|---|---|
| 1 | S1 | 95 | 4.2 | 0.8 | P6 | 6,000 | 13 | 15 | |
| 2 | S2 | 95 | 4.2 | 0.8 | P6 | 7,500 | 14 | 5 | |
| 3 | S3 | 95 | 4.2 | 0.8 | P6 | 5,500 | 13 | 10 | |
| 4 | S1 | 95 | 4.2 | 0.8 | P1 | 1,900 | 11 | 40 | |
| 5 | S1 | 95 | 4.2 | 0.8 | P2 | 500 | 9 | 60 | Substantial diffusion |
| 6 | S1 | 95 | 4.2 | 0.8 | P3 | 4,000 | 12 | 20 | |
| 7 | S1 | 95 | 4.2 | 0.8 | P4 | 200 | 8 | 70 | Substantial diffusion |
| 8 | S1 | 95 | 4.2 | 0.8 | P5 | 1,800 | 11 | 35 | |
| 9 | S1 | 95 | 4.2 | 0.8 | P7 | 5,000 | 13 | 10 | |
| 10 | S1 | 95 | 4.2 | 0.8 | P8 | — | — | — | Damaged |

[1] IR is insulating resistance; IR is resistivity between embedded Ag electrodes (distance between electrodes is 30 μm).
[2] Ag distance is diffusion distance of Ag.

As can be seen in the examples 1 to 4, 6, 8 and 9, when the temperature was increased/decreased at a rate of at least about 10° C./min at a high temperature of at least 500° C., and total baking time in the high temperature range was set to be about 20 to 90 minutes, diffusion of silver could be suppressed to be as small as possible, and hence, superior dielectric characteristics could be obtained.

In contrast, as can be seen in the examples 5 and 7, when the total baking time at the high temperature of least 500° C. was not less than about 90 minutes, silver diffused substantially. In addition, as can be seen in the example 10, when the total baking time at the high temperature of at least 500° C. was not more than about 20 minutes, sintering of a sintered glass ceramic compact was not sufficiently facilitated and the sintered glass ceramic compact was damaged due to thermal shock.

As has thus been described shown in the examples, a glass ceramic compact that has low resistivity and is sinterable in the air can be sintered at a temperature of not more than a melting point of relatively inexpensive silver, and diffusion of silver into the glass ceramic compact can also be suppressed.

By using the sintered glass ceramic compact thus formed, internal electrodes primarily composed of silver having low resistivity can be simultaneously sintered therewith, and as a result, dielectric resonators and ceramic multi-layer substrates, which have the electrodes described above therein and superior high-frequency characteristics, can be obtained. In addition, according to the method described above, electronic devices, such as LC resonators and LC filters, which have high relative dielectric constants, high Q values and superior temperature stabilities, can be further miniaturized.

While the invention has been particularly shown and described with reference to preferred embodiments thereof, it will be understood by those skilled in the art that the forgoing and other changes in form and details may be made therein without departing from the spirit of the invention.

What is claimed is:

1. A method for manufacturing a ceramic electronic device comprising:
   providing a powdered glass ceramic mixture of BaO—TiO$_2$—ReO$_{3/2}$ dielectric ceramic powder and borosilicate glass powder comprising SiO$_2$ and B$_2$O$_3$, in which Re is a rare earth element;
   forming the powdered glass ceramic mixture into a glass ceramic green sheet;
   forming a conductive pattern comprising silver on the glass ceramic green sheet; and
   heating a glass ceramic compact comprising a plurality of the glass ceramic green sheets provided with the conductive pattern to a temperature above about 500° C. at a heating rate of at least about 10° C./minute, and holding the glass ceramic compact at the temperature above about 500° C. for a total time of about 20 to 90 minutes.

2. The method according to claim 1, wherein the glass ceramic compact is held at the maximum temperature above about 500° C. for about 10 to 60 minutes, and then cooled at a cooling rate of at least about 10° C./minute to below about 500° C.

3. The method according to claim 2, wherein the dielectric ceramic powder has a composition represented by the formula xBaO—yTiO$_2$—zReO$_{3/2}$, wherein, on a molar basis, $5 \leq x \leq 20$, $52.5 \leq y \leq 70$, and $15 \leq z \leq 42.5$ and x+y+z=100.

4. The method according to claim 3, wherein the dielectric ceramic powder comprises about 3 to 30 percent by weight of bismuth oxide as Bi$_2$O$_3$ or lead oxide as PbO or both.

5. The method according to claim 3, wherein the dielectric ceramic powder comprises about 3 to 30 percent by weight of bismuth oxide.

6. The method according to claim 5, wherein the glass powder comprises about 13 to 50 percent by weight of SiO$_2$, about 3 to 30 percent by weight of B$_2$O$_3$, about 40 to 80 percent by weight of an alkaline earth metal oxide and about 0.1 to 10 percent by weight of an alkali metal oxide.

7. The method according to claim 6, wherein the powdered glass ceramic mixture comprises powdered copper oxide.

8. The method according to claim 7, wherein the powdered glass ceramic mixture comprises about 75 to 95 percent by weight of the dielectric ceramic powder, about 2 to 20 percent by weight of the glass powder, and not more than about 5 percent by weight of the powdered copper oxide.

9. The method according to claim 8, wherein the powdered glass ceramic mixture comprises about 0.1 to 2 pph of the powdered copper oxide.

10. The method according to claim 9, wherein the maximum heating temperature is about 900 to 1050° C.

11. The method according to claim 1, wherein the maximum heating temperature is about 900 to 1050° C.

12. The method according to claim 1, wherein the dielectric ceramic powder has a composition represented by the formula $xBaO\text{—}yTiO_2\text{—}zReO_{3/2}$, wherein, on a molar basis, $5 \leq x \leq 20$, $52.5 \leq y \leq 70$, and $15 \leq z \leq 42.5$ and $x+y+z=100$.

13. The method according to claim 1, wherein the dielectric ceramic powder comprises about 3 to 30 percent by weight of bismuth oxide.

14. The method according to claim 1, wherein the glass powder is a borosilicate glass-powder comprising $SiO_2$ and $B_2O_3$.

15. The method according to claim 1, wherein the glass powder comprises about 13 to 50 percent by weight of $SiO_2$, about 3 to 30 percent by weight of $B_2O_3$, about 40 to 80 percent by weight of an alkaline earth metal oxide and about 0.1 to 10 percent by weight of an alkali metal oxide.

16. The method according to claim 1, wherein the powdered glass ceramic mixture comprises powdered copper oxide.

17. The method according to claim 1, wherein the powdered glass ceramic mixture comprises about 75 to 95 percent by weight of the dielectric ceramic powder, about 2 to 20 percent by weight of the glass powder, and not more than about 5 percent by weight of the powdered copper oxide.

18. The method according to claim 17, wherein the powdered glass ceramic mixture comprises about 0.1 to 2 pph of the powdered copper oxide.

* * * * *